United States Patent
Schmidt

(10) Patent No.: US 9,549,494 B2
(45) Date of Patent: Jan. 17, 2017

(54) METHOD FOR POPULATING CIRCUIT CARRIERS

(71) Applicant: Infineon Technologies AG, Neubiberg (DE)

(72) Inventor: Michael Schmidt, Dortmund (DE)

(73) Assignee: Infineon Technologies AG, Neubiberg (DE)

( * ) Notice: Subject to any disclaimer, the term of this patent is extended or adjusted under 35 U.S.C. 154(b) by 133 days.

(21) Appl. No.: 14/295,408

(22) Filed: Jun. 4, 2014

(65) Prior Publication Data

US 2014/0364996 A1 Dec. 11, 2014

(30) Foreign Application Priority Data

Jun. 11, 2013 (DE) .......................... 10 2013 210 847

(51) Int. Cl.

| | |
|---|---|
| *G06F 7/00* | (2006.01) |
| *H05K 13/08* | (2006.01) |
| *H01L 23/00* | (2006.01) |
| *H01L 21/67* | (2006.01) |

(52) U.S. Cl.
CPC ............... *H05K 13/08* (2013.01); *H01L 24/29* (2013.01); *H01L 24/75* (2013.01); *H01L 24/83* (2013.01); *H01L 24/95* (2013.01); *H01L 21/67144* (2013.01); *H01L 2224/29339* (2013.01); *H01L 2224/32225* (2013.01); *H01L 2224/8384* (2013.01); *H01L 2224/83192* (2013.01); *H01L 2224/83801* (2013.01)

(58) Field of Classification Search
USPC ........................................................ 700/223
See application file for complete search history.

(56) References Cited

U.S. PATENT DOCUMENTS

| | | | | |
|---|---|---|---|---|
| 6,055,049 A | * | 4/2000 | Mueller | H05K 13/08 356/243.1 |
| 2003/0133116 A1 | * | 7/2003 | Lam | G01B 11/272 356/401 |
| 2004/0111875 A1 | * | 6/2004 | Hogerl | H01L 21/67144 29/742 |
| 2004/0163242 A1 | | 8/2004 | Fukunaga | |
| 2005/0230043 A1 | * | 10/2005 | Neuhoff | B65B 9/02 156/297 |
| 2012/0100697 A1 | * | 4/2012 | Yasuda | C09J 7/0207 438/464 |

FOREIGN PATENT DOCUMENTS

| | | |
|---|---|---|
| CN | 1318275 A | 10/2001 |
| JP | 2011210799 A | 10/2011 |

* cited by examiner

*Primary Examiner* — Kyle Logan
(74) *Attorney, Agent, or Firm* — Murphy, Bilak & Homiller, PLLC

(57) ABSTRACT

A set of circuit carriers includes a number of N≥1 circuit carriers, each of which has an upper side, an underside opposite from the upper side, a distinctive structure, and a conductor structure on the upper side. Each of the circuit carriers is populated by: determining a first relative position between the distinctive structure and the conductor structure; picking up the circuit carrier by a pickup of a lifting and positioning unit; determining a second relative position between the lifting and positioning unit and the distinctive structure of the circuit carrier picked up by the pickup; and populating the circuit carrier with one or more components while taking the first relative position and the second relative position into account.

15 Claims, 9 Drawing Sheets

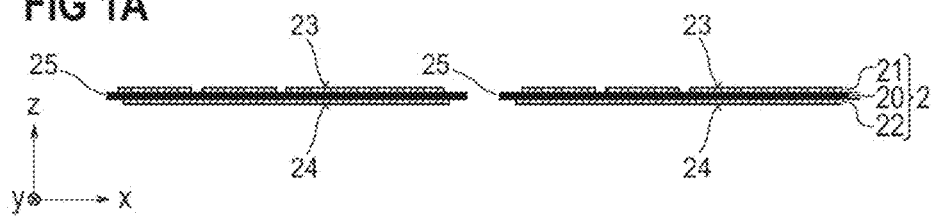
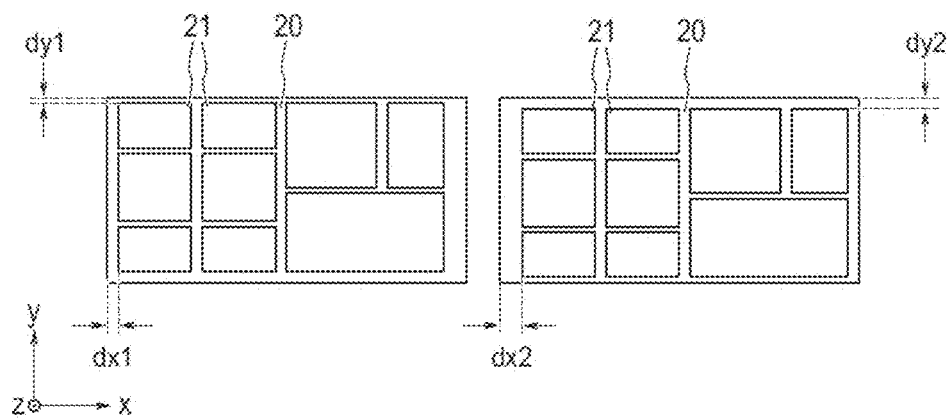
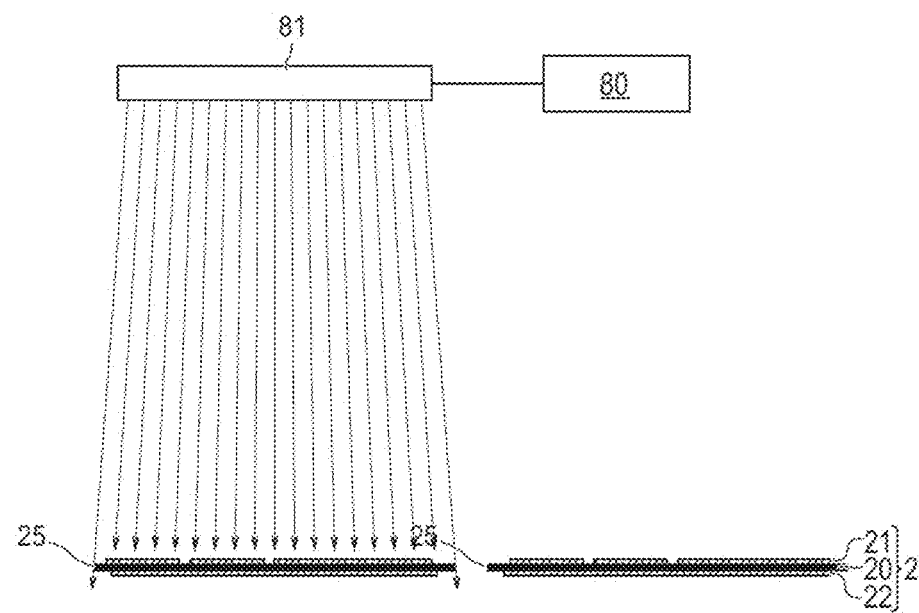

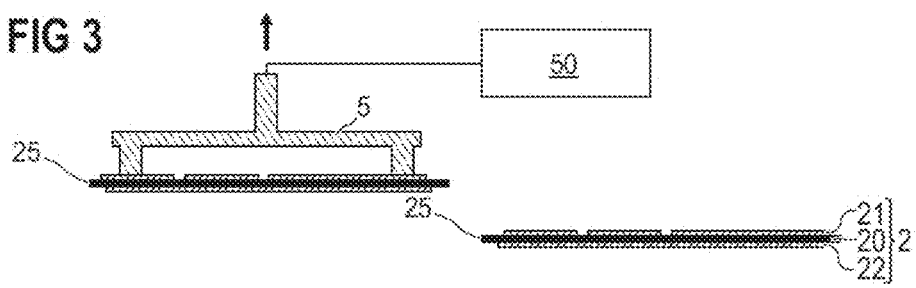
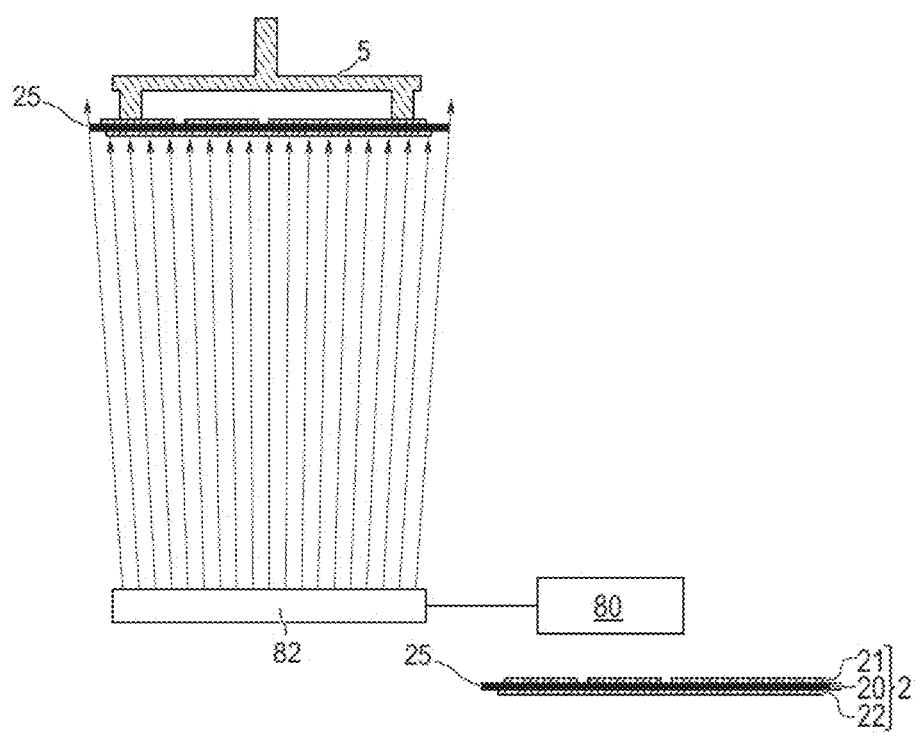
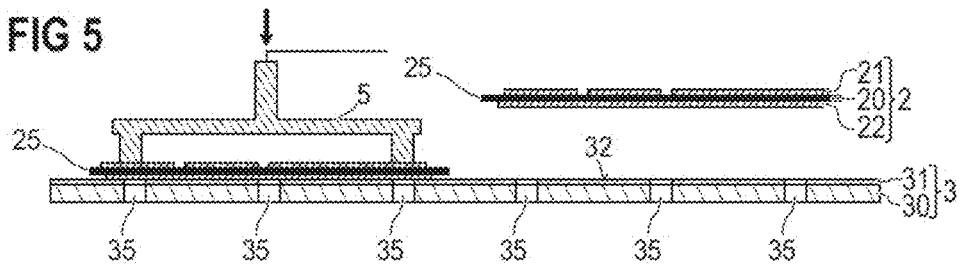

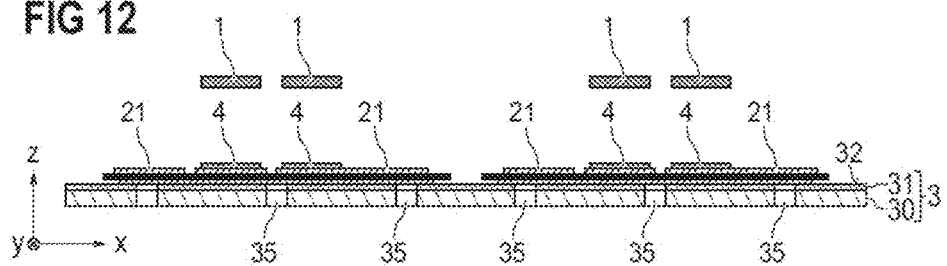
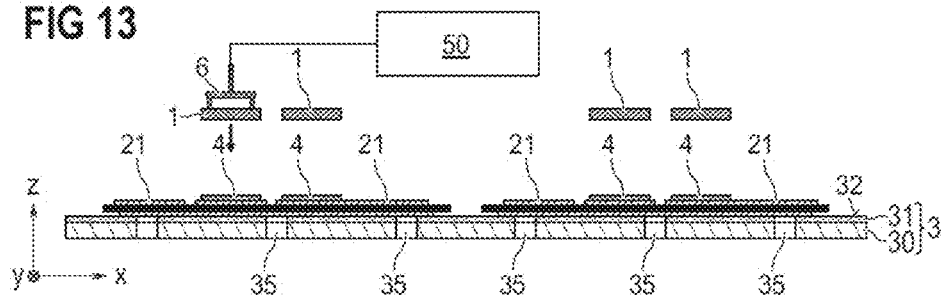
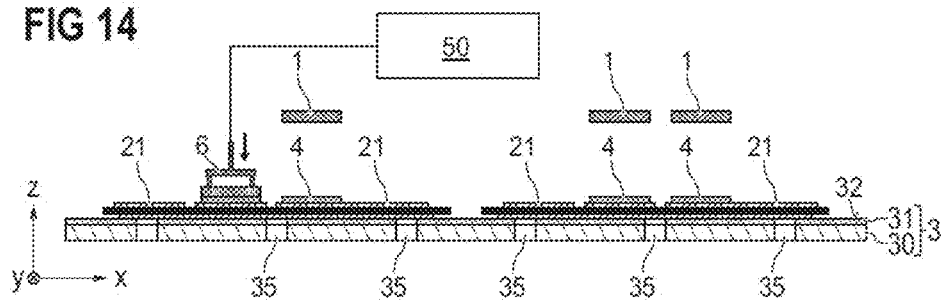
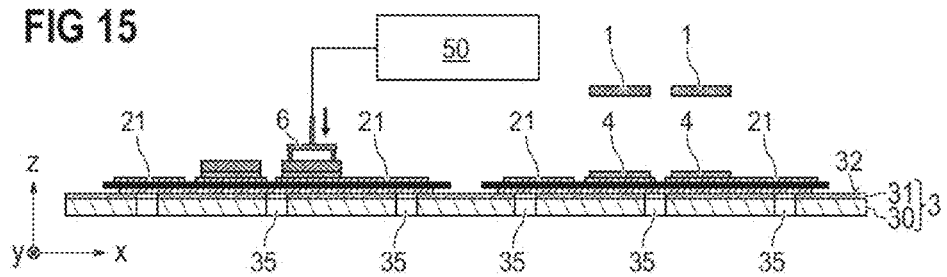

METHOD FOR POPULATING CIRCUIT CARRIERS

PRIORITY CLAIM

This application claims priority to German Patent Application No. 10 2013 210 847.8, filed on 11 Jun. 2013, the content of said German application incorporated herein by reference in its entirety.

BACKGROUND

In the processing of circuit carriers, such as are used for example in semiconductor modules, positioning inaccuracies occur during each of various process steps and mount up over the course of the processing. As a result, necessary safety margins, as are required for example to avoid voltage flashovers, must be of a correspondingly generous size. As a result, this has the effect that the circuit carriers have to be designed with a correspondingly large surface area because of these positioning inaccuracies, in order to avoid positional misplacements, short-circuits or voltage flashovers. Furthermore, these positioning inaccuracies limit the achievable integration density of the components that are fitted on the circuit carrier.

SUMMARY

Embodiments described herein provide a method for producing a semiconductor module with improved positioning accuracy.

According to one embodiment, a set comprising N≥1 circuit carriers is populated, each of which has an upper side, an underside, opposite from the upper side, a distinctive structure and also a conductor structure located on the upper side. In this case, a first relative position between the distinctive structure and the conductor structure is determined for each of the circuit carriers. Furthermore, once it has been picked up by the pickup of a lifting and positioning unit, a second relative position between the distinctive structure of the circuit carrier concerned and the lifting and positioning unit is determined for each of the circuit carriers in the picked-up state. After that, each of the circuit carriers is populated with one or more components while taking the first relative position and the second relative position into account.

Optionally, after the determination of the respective second relative position and before it is populated, each of the circuit carriers may be fixed on a carrier. The carrier may for example be formed as an adhesion carrier and have an adhesive surface, onto which the circuit carrier concerned is placed, so that it bonds thereto and is thereby fixed on the carrier. If the set comprises at least two circuit carriers, they may be fixed jointly on the adhesive surface of the same carrier.

The carrier may optionally be reusable, so that the same carrier can be used in the way described for populating two or more sets of circuit carriers.

In order that the circuit carriers, which are generally very thin, can be removed again from the adhesive upper side without any trouble, the adhesion carrier may be set up in such a way that the bonding strength between the adhesive upper side and the circuit carrier underside of the circuit carriers placed onto the adhesive carrier is less than or equal to 4.5 N/cm$^2$ at the points at which the circuit carrier is in contact with the adhesive upper side. In order on the other hand to avoid slipping of the circuit carriers placed onto the adhesion carrier, the adhesion carrier may be set up in such a way that the aforementioned bonding strength is greater than 0.13 N/cm$^2$ at the points at which the circuit carrier is in contact with the adhesive upper side.

Alternatively or in addition, for each of the circuit carriers, the pulling force required for pulling this circuit carrier off the adhesive surface may be greater than 2 times and/or less than 70 times the weight of this circuit carrier.

Those skilled in the art will recognize additional features and advantages upon reading the following detailed description and on viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A shows a vertical section through two provided circuit carriers.

FIG. 1B shows a plan view of the two circuit carriers depicted in FIG. 1A.

FIG. 2 shows the determination of a first relative position between the lateral periphery and the conductor structure of a first of the circuit carriers shown in FIGS. 1A and 1B.

FIG. 3 shows the picking up of the first of the circuit carriers shown in FIGS. 1A and 1B by the pickup of a lifting and positioning unit.

FIG. 4 shows the determination of a second relative position between the pickup and the lateral periphery of the first circuit carrier picked up according to FIG. 3.

FIG. 5 shows the placing and fixing of the first circuit carrier on a carrier.

FIG. 12 shows the quasi-panel with the applied bonding medium after the removal of the template, and also with multiple semiconductor chips.

FIGS. 13 to 15 show various steps in populating the quasi-panel with the semiconductor chips.

DETAILED DESCRIPTION

Figure 6:
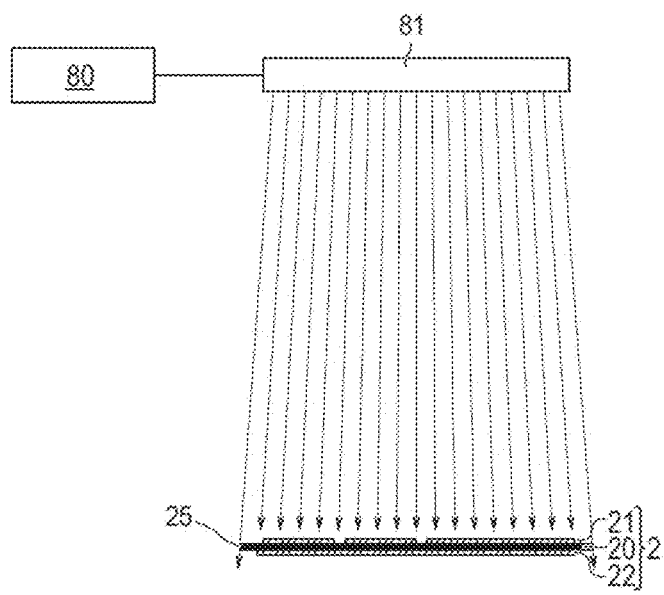
FIG. 6 shows the determination of a first relative position between the lateral periphery and the conductor structure of the second of the circuit carriers shown in FIGS. 1A and 1B.

FIGS. 1A and 1B respectively show in vertical section and in plan view a set comprising, by way of example, two provided circuit carriers 2, each of which has an insulation carrier 20, an upper conductor layer 21, applied to the insulation carrier 20, and also an optional lower conductor layer 22. The upper conductor layer 21 represents a conductor structure. It may optionally be structured to form conductor tracks and/or conductor areas that are independent of one another. Likewise optionally, the upper conductor structure 21 and, if present, the lower conductor structure 22 may be electrically insulated from one another by the insulation carrier 20.

The conductor layers 21 may for example be metallization layers, for example copper or aluminum layers, or conductor layers that are produced by thick-film technology, i.e. from a mixture of metal flakes and an adhesive. Independently of this, the insulation carrier 20 may for example be a dielectric ceramic carrier or some other dielectric carrier. In the case of a dielectric ceramic carrier, the insulation carrier 20 may for example be formed as ceramic platelets, for example of alumina (Al2O3), aluminum nitride (AlN) or zirconia (ZrO2). The circuit carrier 2 may for example be a DCB substrate (DCB=Direct Copper Bonding), a DAB substrate (DAB=Direct Aluminum Bonding), an AMB substrate (AMB=Active Metal Brazing) or an IMS substrate (IMS=Insulated Metal Substrate).

As illustrated by the example shown, all of the circuit carriers 2 of the set may have the same conductor structure 21. In this sense, two circuit carriers 2 have "the same conductor structure" if the conductor structures 21 are congruent. In principle, the invention may however also be used for sets of circuit carriers 2 in which the conductor structures 21 of two or more or all of the circuit carriers 2 of the set are different.

On account of production tolerances in the manufacture of the circuit carriers 2, the position of the conductor structure 21 on the insulation carrier 20 generally deviates from an ideal position. This means, for example, that the distances dx1 and dy1 or dx2 and dy2 that the conductor structures 21 are from the lateral periphery 25 of the circuit carrier 2 in different directions x and y do not necessarily coincide with corresponding preset values. Such deviations may be caused for example by two or more identical or different conductor structures 21 first being produced on a common large insulation carrier, and the large insulation carrier provided with the conductor structures 21 then being cut up into individual circuit carriers 2.

In the case of the example shown, with identical conductor structures 21, this is manifested by the conductor structures 21 of the various circuit carriers 2 being located at different relative positions with respect to the lateral peripheries 25. Apart from that, the insulation carriers 20 of different circuit carriers 2 may have different base areas on account of the previously explained production tolerances.

In order to be able to populate the conductor structures 21 respectively with one or more components in a positionally accurate manner, it is particularly important to know when populating the exact positioning of the conductor structures 21 of the individual circuit carriers 2 in the pick-and-place device being used.

Since the geometry of the conductor structures 21 of the individual circuit carriers 2 is known, the detection device 81 can determine in conjunction with an evaluation unit 80, for example an image-processing computer, the orientation of the conductor structure 21 on the respective circuit carrier 2 with respect to a first distinctive structure of the circuit carrier 2. For this purpose, it is envisaged to determine a first relative position between the first distinctive structure of this circuit carrier 2 and the conductor structure 21 of this circuit carrier 2 for each of the circuit carriers 2. The or a lateral periphery 25 of the circuit carrier 2, or one or more elevations, depressions or through-openings of the circuit carrier 2, or all kinds of register marks (fiducials), may be used for example as the first distinctive structure. If the first distinctive structure is the or a lateral periphery 25 of the circuit carrier 2, it may be provided, as shown, by the or a lateral periphery 25 of the insulation carrier 20 of the circuit carrier 2 concerned.

In order to determine for each circuit carrier 2 a first relative position between a first distinctive structure of this circuit carrier 2 and the conductor structure 21 of this circuit carrier 2, it is possible, as illustrated in FIG. 2, to use for example a first optical detection device 81, for example a camera. Since the geometry of the conductor structures 21 of the individual circuit carriers 2 is known, the detection device 81 can determine, in conjunction with an evaluation unit 80, for example an image-processing computer, the orientation of the conductor structure 21 on the respective circuit carrier 2 with respect to the first distinctive structure. The evaluation unit 80 may in this case be oriented for example on the basis of points of the conductor structures 21 that can be clearly identified, such as for example corners and/or edges of the conductor structure 2. Optionally, after the identification of these points, it is also possible to determine "virtual" points that are dependent on the position of said points, such as for example a "center point" of the conductor structure 21, and to use them for the further calculations.

If the conductor structure has at least two points that can be clearly identified by the detection device 81 in conjunction with the evaluation unit 80, the orientation of the conductor structure 21 can at least be established with sufficient accuracy if the circuit carrier 2 is a substantially flat, planar sheet, the alignment of which with respect to the detection device 81 is known. Thus, for example, a detection device 81 formed as a camera may have an optical axis that is aligned perpendicularly or at some other known angle to a plane onto which the circuit carrier 2 is placed while it is being measured by the detection device 81.

If the conductor structure even has three or more points that can be clearly identified, the orientation of the conductor structure 21 can even be determined if the circuit carrier 2 is not a flat sheet and/or if the circuit carrier 2 is not placed onto a plane to be measured. To identify the first distinctive structure of the circuit carrier 2 and the orientation thereof, the detection device 81 can likewise be used in conjunction with the evaluation unit 80.

Once the circuit carrier 2 has been measured in the way explained with the aid of the first detection device 81, it can be picked up with the aid of a pickup 5 of a lifting and positioning unit 50, as is shown for example in FIG. 3. During picking up, the circuit carrier 2 may be raised, which is illustrated in FIG. 3 by an arrow, and/or brought into some other desired position.

The pickup 5 may for example be a negative-pressure suction device or a gripper. With the aid of the lifting and positioning unit 50, the circuit carrier 2 can be positioned, as shown in FIG. 4, above a second detection device 82 and measured with the aid thereof. The second detection device 82 may likewise be an optical detection device, for example a camera. As with the first detection device 81, it is also possible with the second detection device 82, optionally again in conjunction with the already mentioned evaluation unit 80, to identify a second distinctive structure of the circuit carrier 2. Also in the case of the second distinctive structure, the or a lateral periphery 25 of the circuit carrier 2, or one or more elevations, depressions or through-openings of the circuit carrier 2, or all kinds of register marks (fiducials), may be used for example.

The second distinctive structure may in this case be identical to the first distinctive structure, which has already been determined by means of the first detection device 81 in conjunction with the evaluation unit 80, but it may also be a different distinctive structure, as long as the position thereof with respect to the first distinctive structure is known, so that the orientation of the first distinctive structure can be deduced from the orientation of the second distinctive structure. In this way, a second relative position between the lifting and positioning unit 50 and the first distinctive structure 25 can be determined for each of the circuit carriers 2.

As is evident from the comparison of FIGS. 2 and 4, the first distinctive structure and the second distinctive structure may be the same structure, in the example shown at the lateral periphery 25 of the respective circuit carrier 2, to be precise even when the first detection device 81 and the second detection device 82 are located on opposite sides of the circuit carrier 2 during the respective measuring. A corresponding situation would also apply, for example, when the distinctive structure is a through-opening of the circuit carrier 2, which can be seen both from the upper side 23 and from the underside 24 of the circuit carrier 2.

Since the circuit carrier 2 has a thickness>0, measuring inaccuracies may occur during the detection of the position of the first and/or second distinctive structure by the first detection device 81 and/or by the second detection device 82. If the first or second distinctive structure is for example the lateral periphery 25 of the circuit carrier 2, the determined position of the periphery 25 generally differs slightly from the actual position thereof. This error can be kept small, however, if the circuit carrier 2 has a small thickness and if the first detection device 81 and the second detection device 82 are kept sufficiently far away from the circuit carrier 2 during the respective measurement, since the measurement is then performed quasi-perpendicularly to the circuit carrier 2. A corresponding situation also applies whenever the first or second distinctive structure is a through-opening through the circuit carrier 2.

Once a circuit carrier 2 has been measured with the aid of the first detection device 81 and the second detection device 82, it can be fixed on the surface 32 of a carrier 3, as shown in FIG. 5, in such a way that its position on the carrier 3 does not change.

Figure 7:
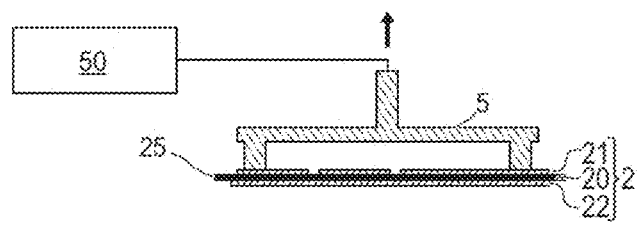
FIG. 7 shows the picking up of the second of the circuit carriers shown in FIGS. 1A and 1B by the pickup.
Figure 8:
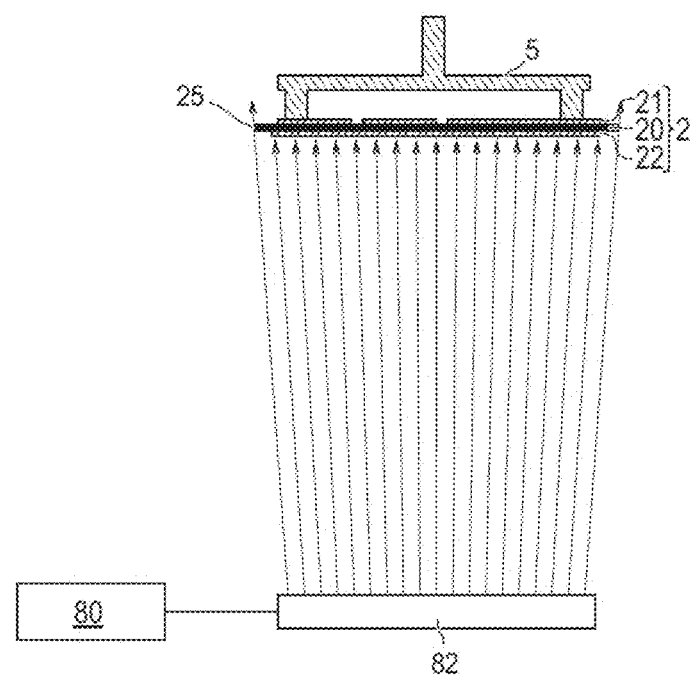
FIG. 8 shows the determination of a second relative position between the pickup and the lateral periphery of the second circuit carrier picked up according to FIG. 7.
Figure 9:
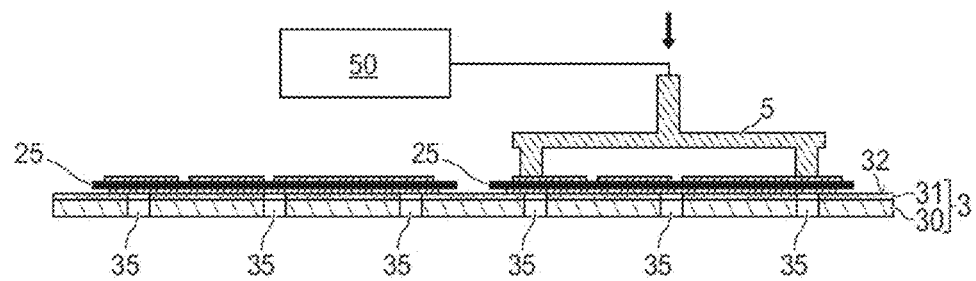
FIG. 9 shows the placing and fixing of the second circuit carrier on the carrier.
Figure 10A:
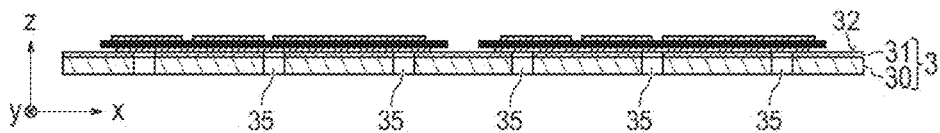
FIG. 10A shows the two circuit carriers fixed on the carrier to form a quasi-panel.
Figure 10B:
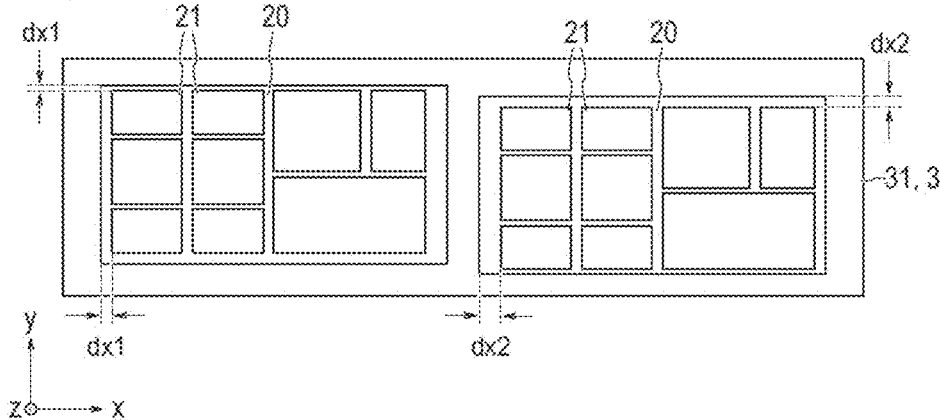
FIG. 10B shows a plan view of the quasi-panel according to FIG. 10A.

In the same way, a further circuit carrier 2 can then firstly be measured with the aid of the first detection device 81 (FIG. 6), be picked up by the same or another pickup 5 (FIG. 7) and measured in the picked-up state with the aid of the second detection device 82 (FIG. 8) and fixed by the pickup 5 on the surface 3 of the carrier 3 in such a way that its position on the carrier 3 does not change, the result of which is shown in FIG. 9 and in FIG. 10A after the removal of the pickup 5. FIG. 10B shows the arrangement according to FIG. 10A in plan view. The arrangement according to FIGS. 10A and 10B forms a quasi-panel, in which all of the circuit carriers 2 fixed on the carrier 3 can be processed as an assembly.

For fixing the circuit carriers 2 on the carrier 3, the latter may be formed as an adhesion carrier, which has an adhesive surface 32. To realize the adhesive surface 32, the adhesion carrier 3 may have an adhesion layer 31, which may consist of a polymer and be applied to a base carrier 30. In this case, the adhesion layer 31 may be applied to the base carrier 30 over the full surface or in a structured form. The polymer adhesion layer 31 may either contain silicone or be free of silicone. Optionally, the adhesion carrier 3 may have a number of through-openings 35, each of which extends right through between the adhesive surface 32 and the underside 33.

Not just such an adhesion carrier but any desired carrier that is capable of fixing the circuit carriers 2 in the way described may be used however as the carrier 3. For example, a sheet with a multiplicity of small openings through which the circuit carriers are sucked against the sheet by negative pressure, and are thus fixed on it, may also be used for this purpose.

As an example of the further processing, populating the individual circuit carriers 2 with semiconductor chips 1 is explained below. In principle, however, any other desired alternative or additional processing steps may be carried out while preserving the quasi-panel.

A prerequisite for this is merely that the preservation of the quasi-panel is not put at risk by the respective process conditions. Such a process condition could be, for example, that the adhesion between the circuit carriers 2 and the adhesive surface 32 is reduced so greatly by the effect of temperature that for example the circuit carriers 2 can slip on or fall off the adhesion carrier 3.

In order that the circuit carriers 2 can be removed from the adhesive surface 32 after their processing without any trouble, the adhesion layer 31 may be set in such a way that the bonding strength between the circuit carrier underside 25 and the adhesive surface 32 is less than or equal to 4.5 N/cm$^2$ at the points at which the circuit carrier 2 is in contact with the adhesive surface 32. In order on the other hand to avoid slipping of the circuit carriers placed onto the adhesion carrier, the adhesion carrier may be set in such a way that the aforementioned bonding strength is greater than 0.13 N/cm$^2$ at the points at which the circuit carrier 2 is in contact with the adhesive surface 32.

When setting the bonding strength, it must be taken into account that it is dependent not only on the properties of the adhesion layer 31 but also on the properties of the undersides of the circuit carriers 2. The decisive properties lie on the one hand in the combination of the materials involved, i.e. the material of the adhesion layer 31 and the material that forms the circuit carrier underside, on the other hand in the surface geometry of the adhesive surface 32 and the circuit carrier underside. Thus, the bonding strength can for example be reduced by a structuring of the adhesion layer 31 (for example to form multiple portions that are separate from one another or by clearances in the adhesion layer 31), so that not the entire circuit carrier underside is in contact with the adhesion layer 31. For example, as in the case of all other configurations of the invention, the bonding strength may be set here in such a way that the pulling force that is required for pulling the circuit carrier 2 off the adhesive surface 32 is greater than 2 times the weight of the circuit carrier 2, and/or less than 70 times the circuit carrier 2.

Figure 11A:
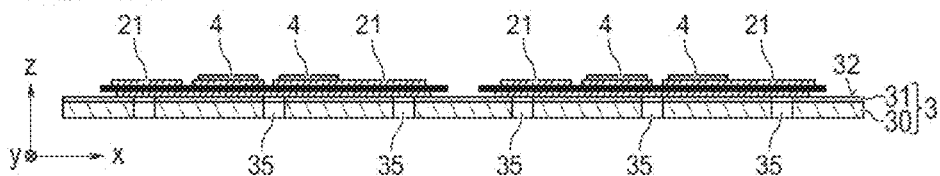
FIG. 11A shows the quasi-panel according to FIGS. 10A and 10B after applying a bonding medium to the conductor structure.
Figure 11B:
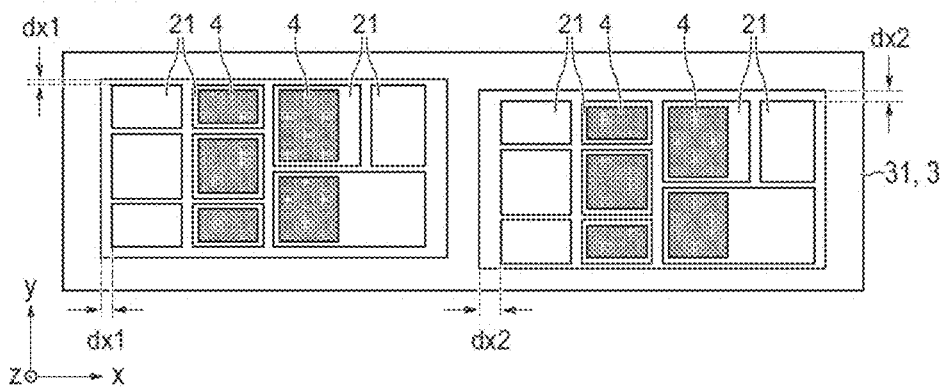
FIG. 11B shows a plan view of the arrangement according to FIG. 11A.

As also shown in vertical section in FIG. 11A and in plan view in FIG. 11B, to fasten semiconductor chips on the circuit carriers 2, a bonding medium 4 may firstly be applied in a structured manner. The application of the bonding medium 4 may for example be performed with the aid of a template, which is provided with openings into which the bonding medium 4 is introduced with the aid of a doctor blade. In this way, the circuit carriers 2 are provided with a layer of the bonding medium 4 in the region of the openings in the template.

The bonding medium 4 may for example be a paste containing metal, for example a solder paste or a sinterable paste. A sinterable paste may, for example, contain a mixture of silver powder or silver flakes and a solvent. The bonding medium 4 may similarly be an electrically conducting or electrically insulating adhesive.

Figure 16A:
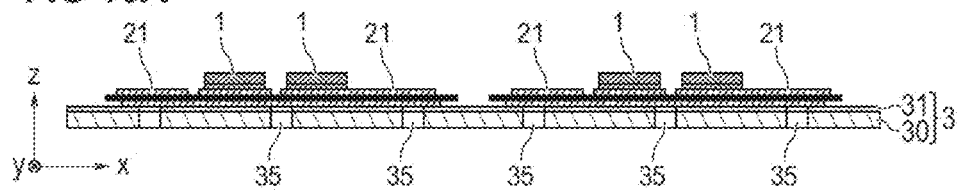
FIG. 16A shows a vertical section through the quasi-panel populated with semiconductor chips.
Figure 16B:
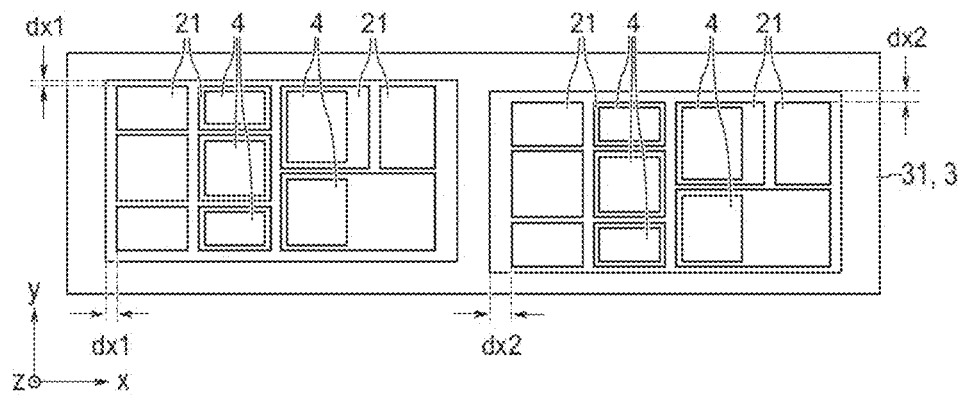
FIG. 16B shows a plan view of the arrangement according to FIG. 16A.

FIG. 12 shows the quasi-panel with the applied bonding medium 4 after the removal of the template, and also with multiple provided semiconductor chips 1. As also represented in FIGS. 13 to 15, each of the circuit carriers 2 is then populated with one or more semiconductor chips 1, in that the semiconductor chips 1 are sequentially placed onto the previously applied bonding medium 4. As an alternative to this, there is also the possibility however of placing two or more or all of the semiconductor chips 1 onto the circuit carriers 2 simultaneously. The placing of the semiconductor chips 1 is performed by means of a conventional pick-and-place device 6. The pick-and-place device 6 may in this case be a component part of the same or another lifting and positioning unit 50 as the pickup 5. FIG. 16A shows a vertical section through the quasi-panel populated with the semiconductor chips 1, and FIG. 16B shows a plan view of the arrangement according to FIG. 16A.

The placing of the semiconductor chips 1 on the respective circuit carrier 2 or on the conductor structure 21 thereof that is provided with the bonding medium 4 is in any event performed while taking into account the first and second relative positions determined in advance for this circuit carrier 2. This means that the position of the conductor structure 21 (known in its form) in relation to the first distinctive structure (first relative position) can be determined by the determination of the position of the first distinctive structure of the circuit carrier 2. The second relative position is then obtained by the determination of the position of the second distinctive structure of the circuit carrier 2 picked up by the pickup 5 in relation to the lifting and positioning unit 50. Since the position of the second distinctive structure in relation to the first distinctive structure is known, the actual position of the conductor structure 21 with respect to the lifting and positioning unit 50 can be deduced from it. In this way it is possible to determine precisely the position of a portion of the conductor structure 21 that is to be populated with a component 1 in relation to the lifting and positioning unit 50, and as a result to place the component 1 precisely onto this portion.

Figure 17:
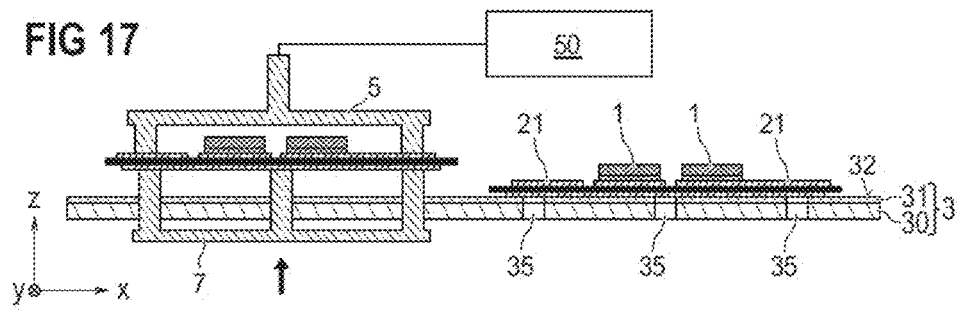
FIGS. 17 and 18 show two steps during the removal of the populated first circuit carrier from the carrier.
Figure 18:
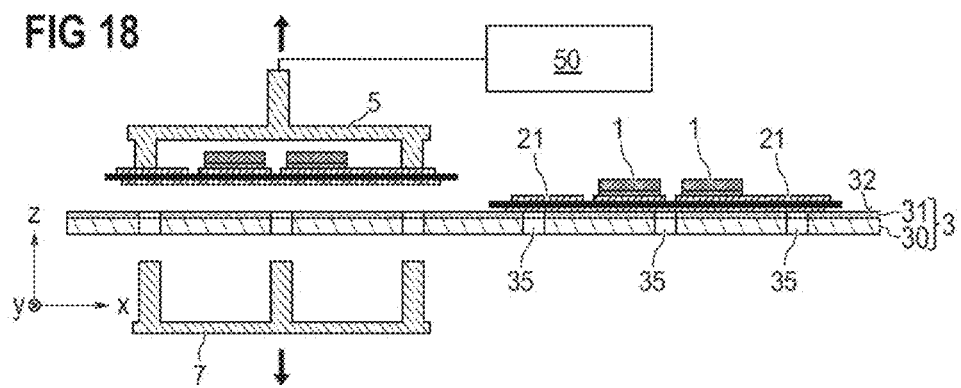

Once all of the semiconductor chips 1 have been placed onto the various circuit carriers 2 in the way described, the circuit carriers 2 provided with the semiconductor chips 1 can be removed from the carrier 3, which is explained on the basis of FIGS. 17 and 18. The removal is performed in turn by using a pickup 5. This may be the same pickup 5 as that described above with reference to FIGS. 3 to 5 and 7 to 9 or a different pickup.

Optionally, the removal of the circuit carriers 2 provided with the bonding medium 4 and the semiconductor chip or chips 1 may be assisted with the aid of a detaching tool 7. The detaching tool 7 has one or more projections 71, which can respectively be inserted into the through-openings 35 from the underside of the carrier 3 and pressed in the direction of the surface 32 against the circuit carrier 2, so that the latter can be separated from the surface 32 and removed with the aid of the pickup 5. Depending on the size of the circuit carrier 2 and its mechanical stability, the number, size and distribution of the projections 71, and therefore also of the through-openings 35, may be adapted in such a way that an excessively uneven loading of the circuit carrier 2 is avoided, and it can be detached without being destroyed.

After the removal of the circuit carriers 2 from the carrier 5, a further set with one or more circuit carriers 2 can be processed in the way described. This may involve the same carrier 5 being reused, and if need be cleaned in advance.

Figure 19:
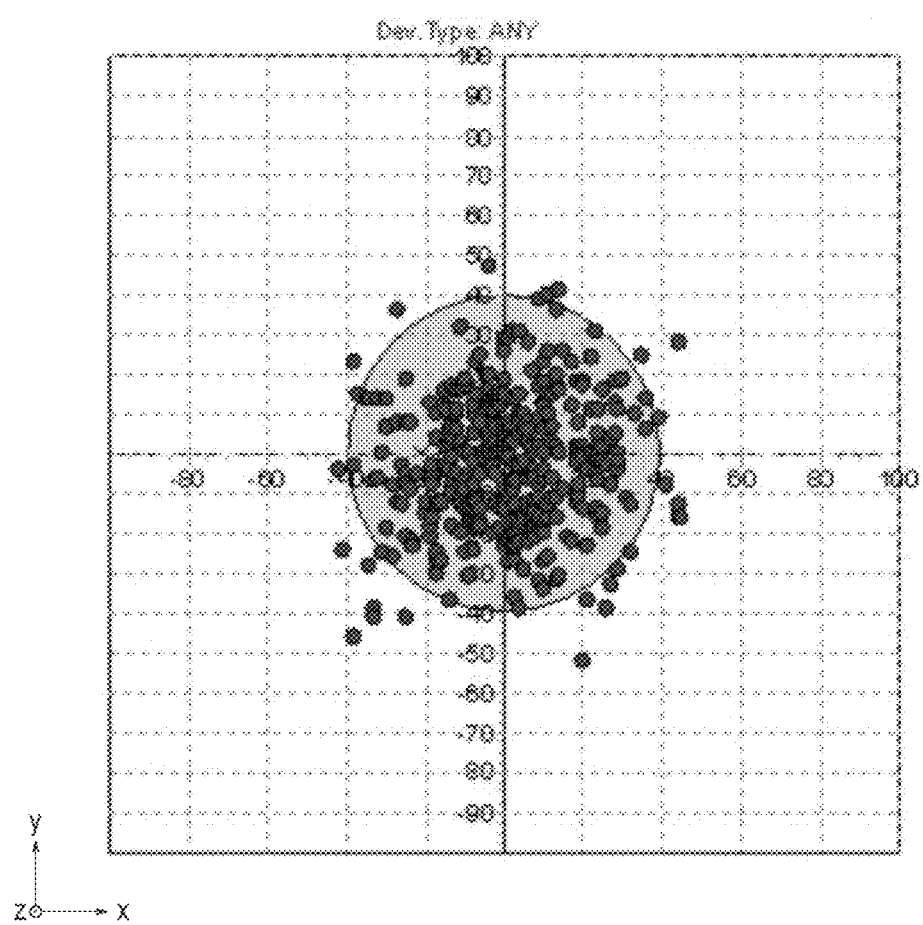
FIG. 19 shows a graphic to illustrate the positioning accuracy achieved.

FIG. 19 shows a graphic to illustrate the positioning accuracy achieved in the course of a test. The individual dots represent for one populated component 1 in each case the deviation in μm (micrometers) from the setpoint value in the directions x and y. The maximum amount of the deviation was 45 μm in the x direction, with a standard deviation of 16.97 μm, and 52 μm in the y direction, with a standard deviation of 16.65 μm, which represents a significant improvement over conventional methods of population.

Figure 20:
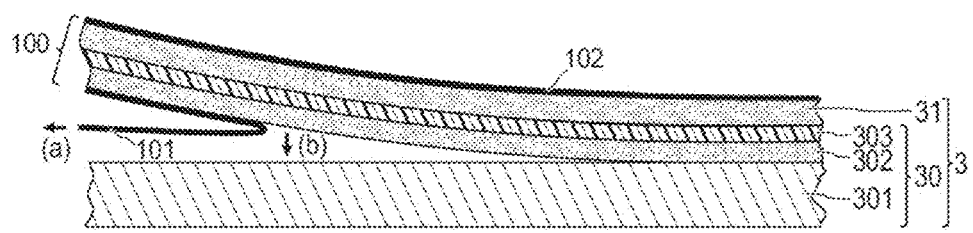
FIGS. 20 and 21 show an example of an adhesion carrier.

FIG. 20 shows an example of an adhesion carrier 3, which has an adhesive surface 32. Such an adhesion carrier 3 may for example be produced by a double-sided adhesive film 100 being adhesively attached to a mechanically stable carrier plate 301. The film 100 has a carrier layer 303, which is provided on one side with an adhesively bonding layer 302 and on the other side with the later adhesion layer 31. By means of the adhesively bonding layer 302, the film 100 is adhesively attached to the carrier plate 301. In order to prevent contamination of the adhesively bonding layer 302 before the adhesive attachment, it may be provided with a first protective film 101, on its side facing away from the carrier layer 303. Correspondingly, the adhesively bonding layer that is the later adhesion layer 31 may be provided with a second protective film 102, on its side facing away from the carrier layer 303, before the placing of the circuit carrier or carriers 2. The production of the adhesion carrier 3 is then performed in such a way that the first protective film 101 is first removed from the adhesively bonding layer 302 (step (a)) and then the film 100 is adhesively attached to the carrier plate 301 (step (b)).

Figure 21:
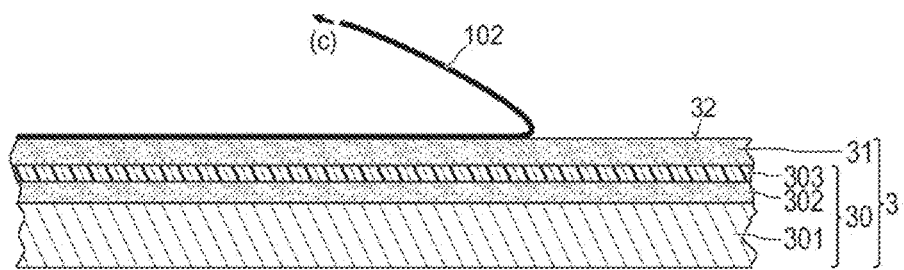

After complete adhesive attachment of the film 100 to the carrier plate 301, the second protective film 102 is then pulled off from the adhesion layer 31, as represented in FIG. 21, so that it is exposed and an adhesive surface 32 is available (step (c)), onto which, as explained above, one or more circuit carriers 2 can be placed. The pulling off of the second protective film 102 cannot take place until immediately before the placing of the circuit carrier or carriers 2, in order to minimize the risk of contamination of the adhesive surface 32.

Optionally, a silicone-free material may be chosen for the adhesion layer 31. In this way it is possible to avoid contamination taking place during the processing of the circuit carriers 2 placed onto the adhesive surface 32 with silicone, which may emerge from the adhesion layer 31. Deposition of silicone on a surface of a circuit carrier, or of a component mounted on a circuit carrier 2, on which a material-bonding connection to a further element is intended to be established (for example by soldering, sintering or adhesive bonding) would reduce the quality of the material-bonding connection.

Aluminum (pure or anodized), glass-filled epoxy or a magnesium alloy are suitable for example as the material for the carrier plate 301. In principle, however, any other desired materials and composite materials may be used, as long as they withstand the respectively required process conditions during the processing of the circuit carriers 2 and have sufficient mechanical stability for the processing, and as long as the adhesively bonding layer 302 can be adhesively bonded to the carrier plate 301.

Glass-epoxy or polyimide, but also any other desired, in particular silicone-free, materials, are suitable for example as the material for the carrier layer 303.

A suitable film 100 is, for example, the silicone-free "assist tape" with the designation "NS-250B" from Shin-Etsu Polymer Europe B.V. in 5928NS Venlo, the Netherlands.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for populating a set of circuit carriers which comprises a number of N≥1 of circuit carriers, each of which has an upper side, an underside opposite from the upper side, and a conductor structure on the upper side, the method comprising for each circuit carrier:
   determining a first relative position between a first distinctive structure of the circuit carrier and the conductor structure;
   picking up the circuit carrier by a pickup of a lifting and positioning unit;
   determining a second relative position between the lifting and positioning unit and a second distinctive structure of the circuit carrier picked up by the pickup;
   placing the circuit carrier on a support carrier;
   determining a precise location of the conductor structure based on the first relative position and the second relative position; and
   attaching one or more components to the conductor structure based on the precise location.

2. The method of claim 1,
   wherein for each circuit carrier, the attaching one or more components occurs only after fixing the circuit carrier to the support carrier.

3. The method of claim 1, wherein the attaching one or more components occurs only after all of the circuit carriers are fixed to the support carrier.

4. The method of claim 1, wherein N≥2.

5. The method of claim 1, wherein for each circuit carrier, the determination of the first relative position is performed by a first optical detection device.

6. The method of claim 5, wherein during the determination of the first relative position for each circuit carrier, the first optical detection device is located on the side of the circuit carrier facing away from the underside.

7. The method of claim 1, wherein for each circuit carrier, the determination of the second relative position is performed by a second optical detection device.

8. The method of claim 7, wherein during the determination of the second relative position for each circuit carrier, the second optical detection device is located on the side of the circuit carrier facing away from the upper side.

9. The method of claim 1, wherein for each of the circuit carriers, the first distinctive structure is identical to the second distinctive structure.

10. The method of claim 9, wherein for each of the circuit carriers, the first distinctive structure and the second distinctive structure are formed by a lateral periphery of the circuit carrier.

11. The method of claim 1, wherein the support carrier is formed as an adhesion carrier which has an adhesive surface and in which, for each circuit carrier, the circuit carrier is fixed on the support carrier by placing the circuit carrier onto the adhesive surface, so that the circuit carrier bonds to the adhesive surface.

12. The method of claim 11, wherein for each of the circuit carriers, the bonding between the adhesive surface and the circuit carriers placed is less than or equal to 4.5 N/cm$^2$ and greater than 0.13 N/cm$^2$ at points at which the circuit carrier is in contact with the adhesive upper side.

13. The method of claim 11, wherein for each of the circuit carriers, a pulling force required for pulling the circuit off the adhesive surface is greater than 2 times and/or less than 70 times the weight of the circuit carrier.

14. A method for populating a first set of circuit carriers and a second set of circuit carriers, the first set of circuit carriers comprising a number of N≥1 of first circuit carriers, each of which has an upper side, an underside opposite from the upper side, and a first conductor structure on the upper side, the second set of circuit carriers comprising a number of M≥1 of second circuit carriers, each of which has an upper side, an underside opposite from the upper side, and a second conductor structure on the upper side, the method comprising:
   for each first circuit carrier:
   determining a first relative position between a first distinctive structure of the first circuit carrier and the first conductor structure;
   picking up the first circuit carrier by a pickup of a lifting and positioning unit;
   determining a second relative position between the lifting and positioning unit and a second distinctive structure of the first circuit carrier picked up by the pickup;
   placing the first circuit carrier on a support carrier;
   determining a first precise location of the first conductor structure based on the first relative position and the second relative position of the first circuit carrier;
   attaching one or more components to the first conductor structure based on the first precise location; and
   fixing the first circuit carrier on the support carrier after determining the second relative position and before attaching the one or more components to the first conductor structure;
   then for each second circuit carrier:
   determining a first relative position between a first distinctive structure of the second circuit carrier and a second conductor structure;
   picking up the second circuit carrier by a pickup of a lifting and positioning unit;
   determining a second relative position between the lifting and positioning unit and a second distinctive structure of the second circuit carrier picked up by the pickup;

placing the second circuit carrier on the support carrier;
determining a second precise location of the second conductor structure based on the first relative position and the second relative position of the second circuit carrier;
attaching one or more components to the second conductor structure based on the second precise location; and
fixing the second circuit carrier on the support carrier after determining the second relative position and before attaching the one or more components to the second conductor structure.

15. The method of claim 14, wherein N≥2 and M≥2.

* * * * *